United States Patent [19]

Miller

[11] 4,411,575
[45] Oct. 25, 1983

[54] SAMPLE TRANSFER VESSEL

[75] Inventor: Mark C. Miller, Chanhassen, Minn.

[73] Assignee: The Perkin-Elmer Corporation, Norwalk, Conn.

[21] Appl. No.: 259,723

[22] Filed: May 1, 1981

[51] Int. Cl.³ .............................................. B65G 61/00
[52] U.S. Cl. ................................ 414/217; 73/864.81;
206/524.1; 220/300; 250/288; 414/225;
414/411; 414/416
[58] Field of Search ............... 414/217, 222, 225, 226,
414/411, 416; 73/864.81; 250/288; 220/293,
300; 206/524.1

[56] References Cited

U.S. PATENT DOCUMENTS 4,308,756 1/1982 Robinson et al. ............... 414/217 X

FOREIGN PATENT DOCUMENTS 1342757 10/1963 France ............................... 220/300

Primary Examiner—Robert G. Sheridan
Attorney, Agent, or Firm—S. A. Giarratana; F. L. Masselle; R. A. Hays

[57] ABSTRACT

A sample transport vessel including a sample block carrier is capable of forming a hermetic seal with a sleeve portion of a lid member. When assembled, the vessel can be used to transport chemically active materials without contamination thereof. In addition, an analytical instrument includes elements adapted to cooperatively interface with the transport vessel.

9 Claims, 4 Drawing Figures

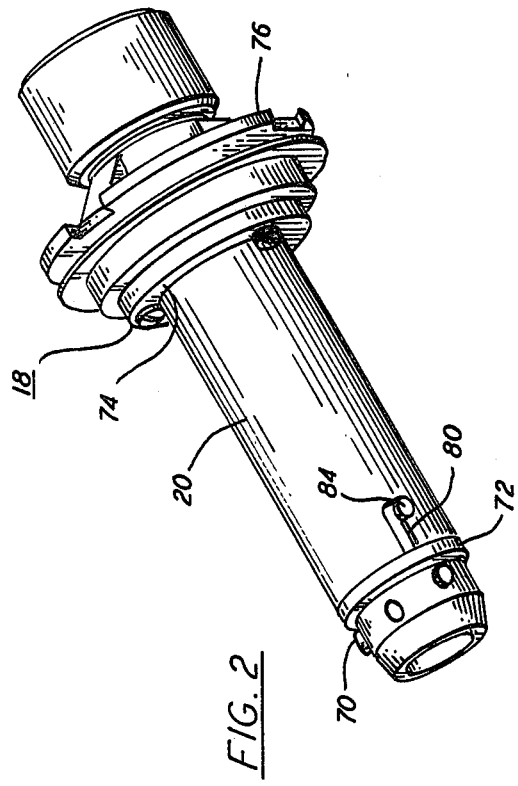
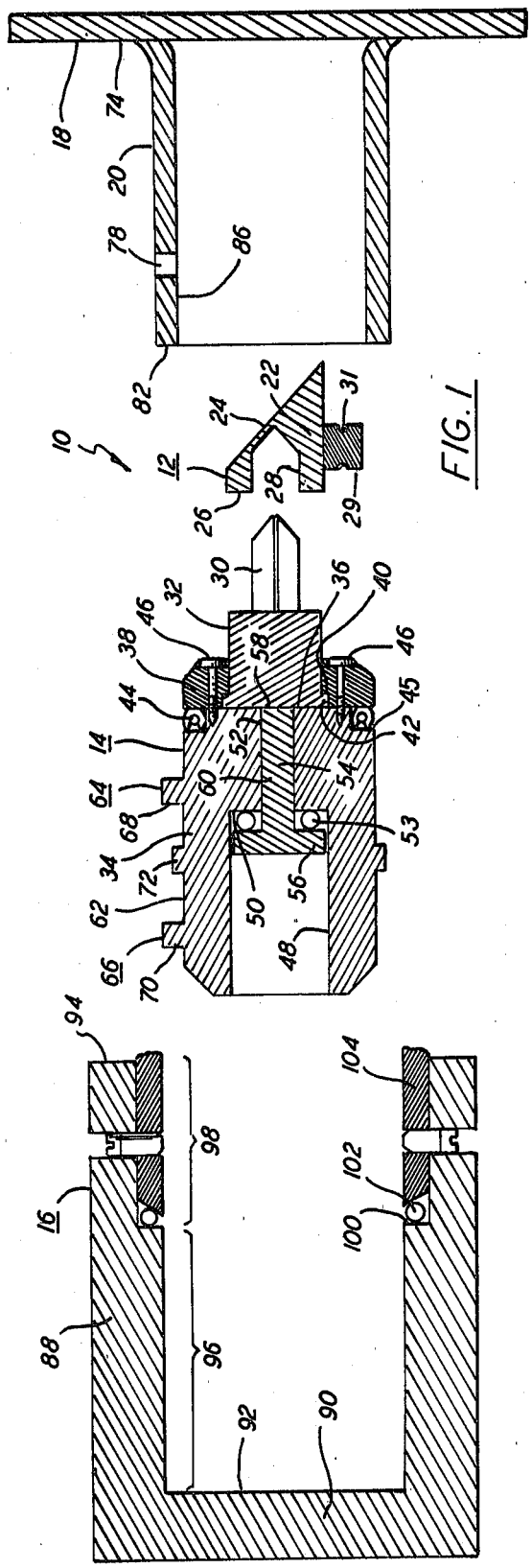
FIG.1
FIG.2

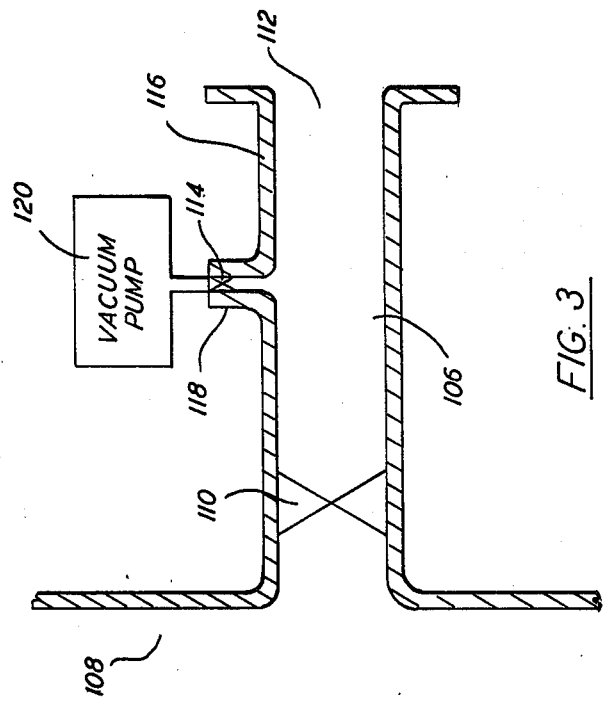
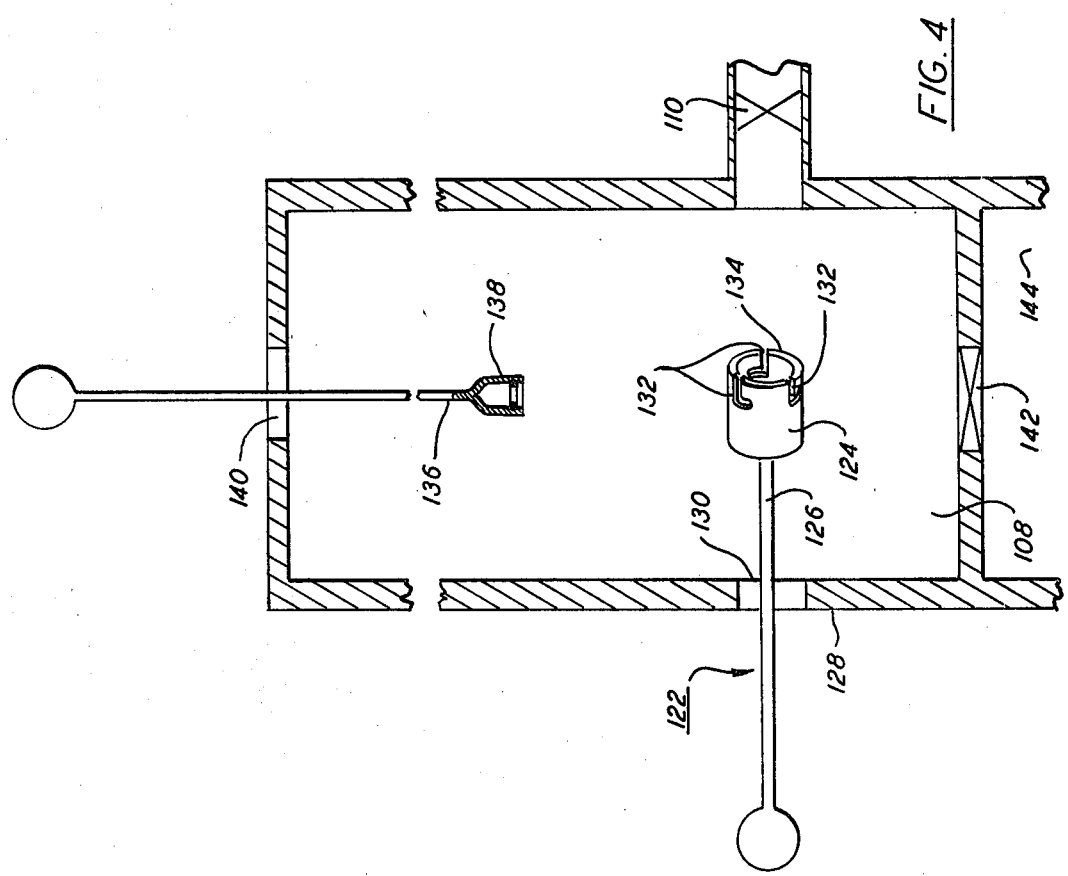

4,411,575

SAMPLE TRANSFER VESSEL

BACKGROUND OF THE INVENTION

The present invention relates to a sample transfer vessel and, in particular, relates to such a vessel adapted to interface with an ultra-high vacuum system.

In recent years several new techniques for determining the elemental and chemical nature of sample surfaces have been developed. A number of the more sophisticated techniques are performed in an ultra-high vacuum environment. One such technique is commonly known as ESCA (electron spectroscopy for chemical analysis) wherein the surface of a sample is bombarded with soft X-rays which liberate photoelectrons from the sample surface. All elements, with the exception of hydrogen, within the bombarded volumes which are present in detectable amounts generate well-defined peaks in the photodetection energy distribution. The elemental composition of the surface is then determined from the energy positions of the peaks in the spectrum. The ESCA technique provides quite accurate information and, because of the degree of accuracy, it is imperative that the surface under analysis be free from any form of contamination.

A sample is susceptible to contamination from the moment it is isolated at its source until it is the ultra-high vacuum environment of the analytical instrument. Ideally, the sample is isolated in close physical proximity with the instrument. However, such physical proximity is rarely available in the practical world. This condition exists for a number of obvious reasons, not the least of which is the expense of the instrument itself. Consequently, samples isolated must usually be transported over substantial distances and time to the site of an instrument where the sample is to undergo analysis.

A generally accepted precaution useful only when handling samples which are quite inactive is to isolate and package the sample in a "glove-box". By using such a device, the sample can even be isolated and packaged in an inert atmosphere. When the sample is removed from the package and inserted into the instrument for anslysis, the entire test chamber is required to be evacuated to the desired level. Such a procedure not only is time consuming but also exposes the sample to a potentially contaminating atmosphere until an ultra-high vacuum is achieved. However, such a precautionary procedure is quite unacceptable where the sample is a chemically active material which can be contaminated by the least exposure to an environment other than an inert or ultra-high vacuum ambient.

From the above discussion, it is clear that there is a dire need for a sample transfer vessel within which a sample can be transported and loaded into an instrument without contamination thereof, regardless of the potential for chemical activity of the sample.

SUMMARY OF THE INVENTION

One object of the present invention is to provide a sample transfer vessel within which an isolated sample can be loaded and subsequently introduced into an ultra-high vacuum environment without contamination.

This object is accomplished, at least in part, by a sample transfer vessel having a sample mounting block which can be affixed to a sample block carrier. The carrier is adapted to slide into a sleeve of a lid member, which lid member is sealable with a canister.

Other objects and advantages will become apparent from the following detailed description and accompanying drawing.

BRIEF DESCRIPTION OF THE DRAWING

The drawing, which is not drawn to scale, includes the following:

FIG. 1, which is a cross-sectional view of a sample transfer vessel embodying the principles of the present invention;

FIG. 2, which is a pictorial view of a partially assembled sample transfer vessel;

FIG. 3 is a sectional view of a portion of an instrument adapted to accept the vessel shown in FIGS. 1 and 2; and FIG. 4 is a pictorial view, partially in section of a cooperative member for use with the vessel shown in FIGS. 1 and 2.

DETAILED DESCRIPTION OF THE INVENTION

A sample transfer vessel, generally indicated at 10 in the drawing and embodying the principles of the present invention, includes a sample mounting block 12, a sample mounting block carrier 14, a canister 16 and a lid member 18 having a sleeve 20 affixed thereto for retaining the carrier 14.

The sample mounting block 12 preferably includes a unitary body 22 having a first end surface 24 and a second end surface 26. In a specific embodiment, the unitary body 22 is a metallic cylinder machined so that the first end surface 24 is beveled with respect to the axis of the cylinder. In addition, the body 22 includes a blind aperture 28 extending into the cylinder from the second end surface 26. Further, for reasons explained below, the block 12 preferably has a nipple 29 extending therefrom which nipple 29 includes a groove 39 therearound. A material, such as aluminium, is preferred for the cylinder, as well as for various other rigid elements of the vessel 10, because of its resistance to outgassing in an ultra-high vacuum environment, as well as for its relative inertness when exposed to adverse ambient conditions. Of course, other materials meeting the above criteria can also be used. The first end surface 24 is beveled with respect to the axis of the body 22, not only to provide a somewhat larger surface area on which to mount the sample specimen, but also, as more fully discussed below, to properly orient the mounted specimen within the instrument. The blind aperture 28 is cooperatively sized to accept a mounting means protruding from the sample block carrier 14.

The sample block carrier 14 thus includes a mounting means 30 which, in the preferred embodiment, is a bifurcated male prong extending from a base member 32 and retains the body 22 thereon. The sample block carrier 14 also includes a mainframe 34 to which the base member 32 is affixed. Preferably, the base member 32 is affixed to one end 36 of the mainframe by means of a flange member 38 having a recessed shoulder 40 cooperatively contacting a rim 42 extending around the perimeter of the base member 32. The flange 38 is mounted to the one end 36 of the mainframe 34 to accomplish the attachment. Preferably, a seal is formed by providing a spring loaded O-ring 44 in a shoulder 45 formed around the one end 36 of the mainframe 34. Thus, when the flange 38 is affixed, via a plurality of screws 46 about the circumference thereof, it captures the O-ring 44 to form the desired seal. The spring loaded O-ring provides a unique advantage in the practical employment of the vessel 10 and is more fully discussed hereinafter.

The mainframe 34 is preferably cylindrical and also includes a blind aperture 48 extending into the second end surface thereof, terminating at a recessed surface 50. In addition, the mainframe 34 includes a threaded opening 52 extending between the recessed surface 50 and the one end surface 36 into which a screw 54 is threaded. Preferably, the screw 54 has a head 56 having a diameter larger than the threaded opening 52, but less than the blind aperture 48. An O-ring 53 is positioned between the head 56 of the screw 54 and the recessed opening 52. For reasons discussed below, the screw 54 is tightened to create a hermetic seal between the head 56 and the recessed surface 50.

The outer surface 62 of the mainframe includes two spaced apart sets, 64 and 66, of protrusions, 68 and 70, and a continuous rim 72 positioned therebetween. On one specific embodiment, each set, 64 and 66, of protrusions, 68 and 70 respectively, includes three male nodes, which are equally distributed about the circumference of the mainframe 34, i.e. having an included angle of 120° between any two adjacent nodes. Preferably, the protrusions, 68 and 70, or nodes, as well as the rim 72, are formed during the initial machining of the mainframe 34 and are thus unitary and integral therewith. The mainframe 34 and the elements thereof are dimensioned so as to slide into the sleeve 20 of the lid member 18.

The lid member 18 having the sleeve 20 extending from one surface 74 thereof, is preferably formed from stainless steel and, as more fully discussed below, is preferably adapted to accept an insertion fixture 76 for handling the lid member 18 when inserting it into an instrument. The sleeve 20 preferably extends perpendicularly from the one surface 74 and includes a plurality of L-shaped openings. The L-shaped openings 78 are spaced about the sleeve 20 so as to accept one set 64 of protrusions 68. Each L-shaped opening 78 has a first leg 80 extending from the end 82 of the sleeve 20 distal from the surface 74 of the lid 18. The length of the first leg 80 of the L-shaped openings 78 is such that when the protrusions 64 reach the bottom thereof, the rim 72 contacts the end 82 of the sleeve. Thus, when the carrier mainframe 34 is inserted into the sleeve 20 and rotated so that the protrusions 64 lockingly rotate into the shorter legs 84 of the L-shaped openings 78, a seal is formed between the rim 72 and the end 82 of the sleeve 20. This seal, however, is not a hermetic seal. Nevertheless, a hermetic seal is created between the carrier 14 and the sleeve 20. The seal is created by the spring loaded O-ring 44, which protrudes beyond the outer surface of the mainframe 34 due to its spring loaded condition. Thus, as the carrier 14 is inserted into the sleeve 20, the spring pressure allows the insertion and yet forces the O-ring 44 into a hermetic seal contact with the inner surface 86 of the sleeve 20. This hermetic seal is one of the unique advantages of the spring loaded O-ring 44 mentioned above. The length of the sleeve 20 is designed so that when the sample block carrier 14 is firmly mounted therein, the sample mounting block 12 is spaced apart from the one surface 74 of the lid member 18. For transporting or storing the hermetically sealed sample, containing lid member 18 is inserted into the canister 16.

The canister 16 is preferably a cylinder 88 having a bottom 90 at one end 92 thereof and being open at the other end 94 thereof. In order to further ensure that contamination of the sample is avoided, the cylinder 88 is provided with a lower portion 96 having a comparatively smaller inside diameter and an upper portion 98 having a comparatively larger inside diameter. A shoulder 100 is formed at the interface of the lower portion 96 and the upper portion 98. An O-ring 102 rests upon the shoulder 100 and is retained by an insert 104, which extends along the upper portion 98 and is held loosely in place by a plurality of locking pieces 106. The insert 104 is dimensioned such that when the lid member 18 is affixed to the canister 16, the O-ring 102 is compressed by the insert 104 to form a seal between the canister 16 and the sleeve 20. Of course, the canister 16 is such that when the lid 18 is affixed thereto, the sample block carrier 14 is spaced apart from the bottom 90.

Referring particularly to FIG. 2, the relationship of the block carrier 14 and the sleeve 20 is shown to emphasize that the second set 66 of protrusions 70 are accessible without breaking the hermetic seal between the spring loaded O-ring 44 and the sleeve 20. The insertion fixture 76 is shown mounted to the lid 18 and the canister 16 has been removed. The vessel 10, with the canister 16 removed, is designed to be inserted into the entry chamber 106 shown in section in FIG. 3.

The entry chamber 106 is a chamber protruding from a preanalysis chamber 108 of an analytical instrument. Preferably, the ambient of the entry chamber 106 can be sealingly separated from the ambient of the preanalysis chamber 108 by a gate valve means 110. The gate valve means 110 can be any such known device which is selectively operable from outside the chambers, 106 and 108, either by electronic or mechanical means. Such devices are well known in the art. Thus, by the gate valve means 110, the ambient in the entry chamber 106 can be exposed, via an entry port 112, to external atmospheric pressure without disturbing any vacuum condition existing within the preanalysis chamber 108.

In one specific embodiment, the entry chamber 106 is a stainless steel cylinder having a port 114 through the wall 116 thereof. The port 114 is provided with a valve assembly 118 similar in purpose to the gate valve means 110. Preferably, a means 120 for controlling the pressure within the entry chamber 106 communicates with the port 114. The means 120 includes a vacuum pump 120 capable of creating an ultra-high vacuum with the entry chamber 106. Thus, when the gate valve means 110 is closed and the gate valve assembly 118 is open, an ultra-high vacuum can be created in the entry chamber 106. Thereafter, when the valve assembly 118 is closed and the gate valve means 110 is opened, the entry chamber 106 and the preanalysis chamber 108 are at substantially the same pressure. As a result, the vessel 10 can be loaded into the entry chamber 106 without the need to break the ultra-high vacuum in the preanalysis chamber 108.

Once the gate valve means 110 is opened to allow communication between the entry chamber 106 and the preanalysis chamber 108, the sample block carrier 14 can be removed from the sleeve 20 by a carrier manipulation shaft 126, which breeches the wall 128 of the preanalysis chamber 108 via a vacuum seal 130.

The carrier manipulation sleeve 124 is, in one specific embodiment, a cup-like member having a plurality of L-shaped openings 132 around the open end 134 thereof. The L-shaped openings 132 are distributed about the one end 134 and dimensional such that they lock on to the set 66 of protrusions 70 of the mainframe 34. Upon rotation of the shaft 126, the mainframe becomes attached to the sleeve 124 and is unlocked from the sleeve 20, thus breaking the hermetic seal previously formed between the carrier 14 and the sleeve 20.

Once the mainframe 34 is attached to the sleeve 124, the shaft 126 is withdrawn to the preanalysis chamber 108. An auxiliary probe 136 is then extended to firmly grasp the sample mounting block 12 and retain the block 12 when the shaft 126 is further withdrawn. The auxiliary probe 136 is equipped with means 138 for retaining the sample mounting block 12. The means 138 can be any known mechanical grasping means, such as via a plurality of spring loaded balls which lock onto the sample block 12 via the groove 31 in the nipple 29. The auxiliary probe 136, extending through another vacuum seal 140, is then extended through a third gate valve means 142 into a main analysis chamber 144 to align the sample or the mounting block 12 with the X-ray source (not shown) of the instrument. The use of the preanalysis chamber 108 is desirable to ensure the final equalization of pressure prior to opening the gate valve means 142 of the main analysis chamber 144. It should be noted that the same vacuum pump 120 used for evacuating the entry chamber 106 can be connected to the preanalysis chamber 108 for the final evacuation thereof. The beveled surface is thus designed to accommodate the position of the source with respect to the plane of the auxiliary probe 136. The vacuum seals, 130 and 140, in the wall 128 of the preanalysis chamber 108 can be any known conventional seal designed for the external manipulative function.

After the sample has been analyzed, the block carrier 14 can be returned to the sleeve 20 by extending the shaft 126 and reversing the rotation to again secure the block 14 to the sleeve 20. The vessel 10 can easily be removed from the entry chamber 106 after the shaft 126 has been withdrawn and the gate valve means 110 closed. It will be recognized that after analysis, an ultra-high vacuum exists in the empty space in the sleeve 20. The carrier block 14 can be easily removed from the sleeve 20 by breaking that vacuum and equalizing the internal and external pressures. This can be accomplished by rotating the screw 54 release pressure from the O-ring 53 and thus break the vacuum.

Although the present invention has been described herein in reference to one particular embodiment, other configurations and arrangements will become apparent herefrom to one skilled in the art without departing from the spirit and scope of the present invention. Hence, the present invention is considered as being limited solely by the appended claims and the reasonable interpretation thereof.

What is claimed is:

1. A sample transport vessel comprising:
   a sample mounting block upon one end face of which a sample can be affixed;
   a sample block carrier having one end adapted to receive and retain said sample mounting block;
   a lid member having a sleeve affixed to one surface thereof and extending therefrom, said sleeve being adapted to accept thereinto said sample block carrier; and
   means, carried by said sample block carrier for forming a hermetic seal between said sample block carrier and said sleeve.

2. The sample transfer vessel as claimed in claim 1 further comprising:
   means for locking said sample block carrier in said sleeve.

3. The sample transfer vessel as claimed in claim 2 wherein:
   said locking means includes a set of protrusions distributed about the periphery of said sample block carrier; and
   at least an equal number of L-shaped openings in said sleeve arranged to accept said protrusions via the longer leg of said openings and upon rotation of said sample block carrier retaining said sample block carrier via the shorter leg of said openings.

4. The sample transfer vessel as claimed in claims 1 or 2 further comprising:
   a canister adapted to receive said lid member such that said sleeve and said sample block carrier extend thereinto.

5. The sample transfer vessel as claimed in claim 4 wherein:
   said canister includes means, associated therewith, for forming a hermetic seal between said canister and said sleeve of said lid member.

6. The sample transfer vessel as claimed in claim 1 or 2 wherein:
   said hermetic seal forming means is a spring loaded O-ring around the periphery of said sample block carrier.

7. A sample transfer system comprising in combination:
   an analytical instrument having an preanalysis chamber and an entry chamber, said entry chamber and said preanalysis chamber being separated by a means for selectively allowing or blocking communication between said chambers said entry chamber being cooperatively formed to accept a sample transport vessel; said sample transport vessel including a sample mounting block upon one end face of which a sample can be affixed, a sample block carrier having one end adapted to receive and retain said sample mounting block, a lid member having a sleeve affixed to one surface thereof and extending therefrom said sleeve being adapted to accept thereinto said sample block carrier; means, carried by said sample block carrier for forming a hermetic seal between said sample block carrier and said sleeve; and
   means for controlling the ambient pressure of said entry chamber.

8. The combination as claimed in claim 7 wherein:
   said entry chamber includes a port adapted to sealingly accept said sample transfer vessel.

9. The combination as claimed in claim 7 further comprising:
   means for manipulating said sample block carrier, said means extending through a wall of said preanalysis chamber whereby, when said entry chamber and said preanalysis chamber are in communication, said sample block carrier can be removed from said sleeve and drawn into said preanalysis chamber via said manipulating means.

* * * * *